US009817407B2

United States Patent
Pomerleau et al.

(10) Patent No.: US 9,817,407 B2
(45) Date of Patent: Nov. 14, 2017

(54) SYSTEM AND METHOD OF OPENING A LOAD LOCK DOOR VALVE AT A DESIRED PRESSURE AFTER VENTING

(71) Applicant: Varian Semiconductor Equipment Associates, Inc., Gloucester, MA (US)

(72) Inventors: Bradley M. Pomerleau, Beverly, MA (US); Eric D. Wilson, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 433 days.

(21) Appl. No.: 14/622,271

(22) Filed: Feb. 13, 2015

(65) Prior Publication Data

US 2016/0155653 A1    Jun. 2, 2016

Related U.S. Application Data

(60) Provisional application No. 62/086,004, filed on Dec. 1, 2014.

(51) Int. Cl.
*H01L 21/673* (2006.01)
*G05D 7/06* (2006.01)
*H01L 21/67* (2006.01)

(52) U.S. Cl.
CPC ..... *G05D 7/0635* (2013.01); *H01L 21/67201* (2013.01)

(58) Field of Classification Search
CPC ........... H01L 21/67201; H01L 21/6719; H01L 21/67253
See application file for complete search history.

(56) References Cited

U.S. PATENT DOCUMENTS

| | | | |
|---|---|---|---|
| 7,381,969 B2 | 6/2008 | Fasheh et al. | |
| 2001/0039921 A1 | 11/2001 | Rolfson et al. | |
| 2002/0159864 A1* | 10/2002 | Lowrance | B66F 11/044 414/11 |
| 2003/0131902 A1* | 7/2003 | Dickinson | B24B 37/345 141/8 |
| 2004/0083588 A1 | 5/2004 | Park | |

(Continued)

FOREIGN PATENT DOCUMENTS

| | | |
|---|---|---|
| JP | 62-209825 A | 9/1987 |
| KR | 10-0529650 B1 | 11/2005 |
| KR | 10-2006-0114574 A | 11/2006 |

OTHER PUBLICATIONS

International Search Report and Written Opinion dated Feb. 15, 2016 in corresponding PCT application No. PCT/US2015/061275.

*Primary Examiner* — Jaehwan Oh

(74) *Attorney, Agent, or Firm* — Nields, Lemack & Frame, LLC

(57) ABSTRACT

A system and method for reducing particulate contamination during the loading and unloading of semiconductor substrates into a load lock chamber of a semiconductor processing tool. One sensor that measures the differential pressure between the inside of the load lock and the outside atmosphere is provided. The method uses an algorithm that predicts when to stop the load lock vent so that a small, positive, repeatable pressure burst is delivered each time the door opens. This algorithm will automatically adjust for changes in the vent rate and response times of system vent components.

10 Claims, 6 Drawing Sheets

(56) References Cited

U.S. PATENT DOCUMENTS

| | | | |
|---|---|---|---|
| 2006/0105548 A1* | 5/2006 | Kudo | H01L 21/67017 438/476 |
| 2007/0043534 A1* | 2/2007 | Arruda | G01M 3/3236 702/183 |
| 2007/0246658 A1* | 10/2007 | Fasheh | H01L 21/67201 250/441.11 |
| 2008/0213082 A1* | 9/2008 | Kato | H01L 21/67069 414/805 |
| 2010/0119351 A1 | 5/2010 | Liu et al. | |
| 2010/0226736 A1* | 9/2010 | Borden | C23C 14/566 414/217 |
| 2010/0326637 A1* | 12/2010 | Sasaki | H01L 21/67201 165/138 |
| 2011/0171830 A1* | 7/2011 | Kaise | H01J 37/32743 438/689 |
| 2011/0265549 A1* | 11/2011 | Cruse | H01L 21/67253 73/1.16 |
| 2011/0265899 A1* | 11/2011 | Cruse | G01L 27/005 137/565.23 |
| 2017/0062250 A1* | 3/2017 | Kogure | H01L 21/67201 |
| 2017/0110350 A1* | 4/2017 | Trussell | H01L 21/67173 |
| 2017/0117169 A1* | 4/2017 | Sakaue | H01L 21/67109 |

\* cited by examiner

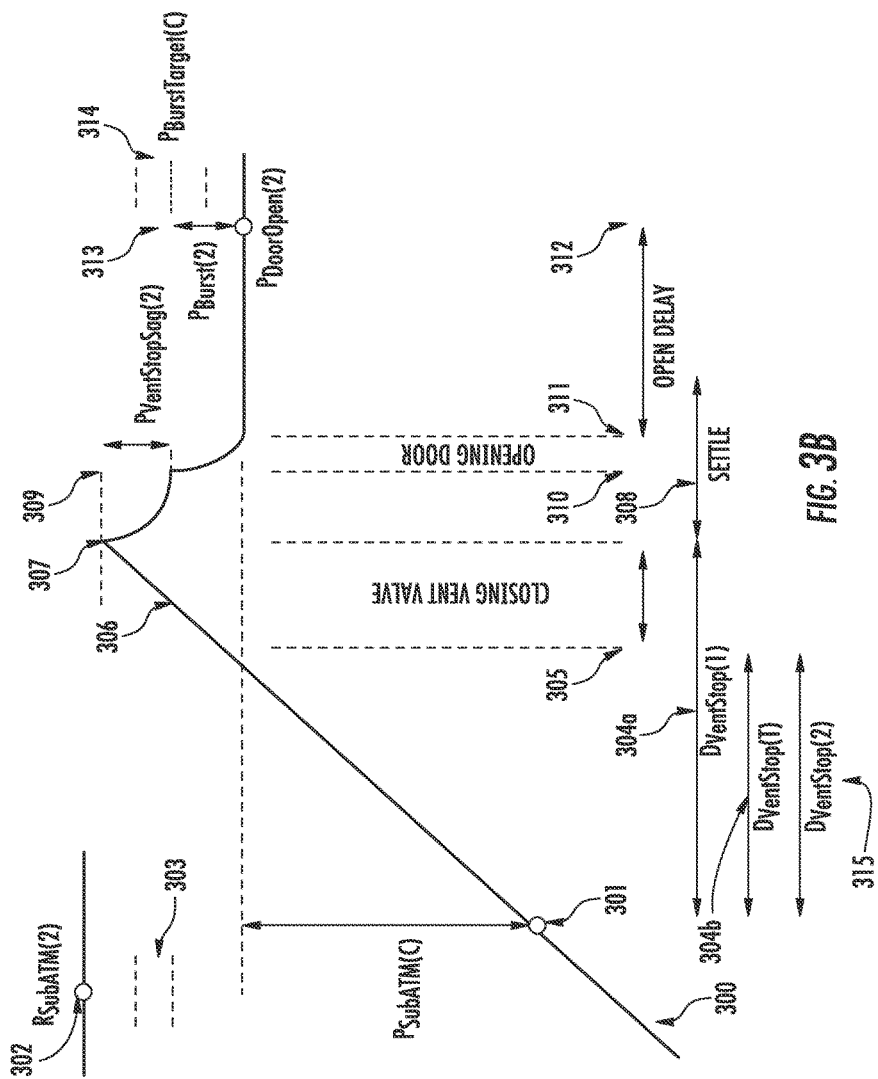

SYSTEM AND METHOD OF OPENING A LOAD LOCK DOOR VALVE AT A DESIRED PRESSURE AFTER VENTING

This application claims priority to U.S. Provisional Patent Application Ser. No. 62/086,004, filed Dec. 1, 2014, the disclosure of which is incorporated herein by reference in its entirety.

FIELD

The present disclosure relates, most generally, to a method and system for venting a load lock chamber to produce a desired pressure burst when the door opens. The system is autocorrecting and adjusts for changes that can occur in the vent rate and vent component response times between tools and over time on the same tool.

BACKGROUND

Many tools in a semiconductor manufacturing facility process wafers in a high vacuum environment. Because the wafers travel from one tool to another at atmosphere, each tool has a way of loading the wafers into a transitional vacuum chamber (load lock) to remove the air pressure before they are handled by the machine into its high vacuum environment. Conversely, this same load lock is typically used to return the wafers from high vacuum environment back to atmosphere for removal after being processed.

While travelling into and out of the tool, the wafers will go through many processes that could potentially stir up and deposit particles onto their surface. For all high vacuum processing tools, a pressure burst which occurs while opening the load lock door after a vent may be a leading cause of particulate contamination. This contamination can destroy the semiconductor devices on top of the wafers and, as their feature sizes continue to shrink, this particle effect on device yield is magnified.

As the critical dimensions of microelectronic devices continue to shrink on silicon wafers, there have been ever increasing efforts to reduce the amount of airborne particles on the wafers as they are handled between processes on semiconductor manufacturing equipment. As stated above, it has been well known that a major potential source of particles on wafers is during the transition between the high vacuum of the semiconductor tool in which they are processed back to atmospheric pressure prior to being removed from the machine. When the load lock door opens at the end of this transition, a significant pressure burst can dislodge dust particles from nearby surfaces. These dust particles can deposit on the wafers as they are being removed.

A load lock is typically vented with nitrogen. If, before opening the door, the $N_2$ pressure in the load lock is greater than the outside air, a positive pressure burst will result. If this burst is large enough, the burst flow can lift dust particles from nearby surfaces around the door and inside the load lock. Then, as the wafers are handled in and out of the load lock, the particles can settle on top of the wafers. A pressure burst in the opposite direction may be created if the door valve is opened when the $N_2$ pressure is significantly less than the outside air pressure. Studies have shown that that this scenario may lead to worse contamination as outside air rushes past the door's o-rings, lifting up dust particles and depositing them on the wafers and load lock surfaces inside.

In general, it is desirable to keep the turbulence of $N_2$ and air to a minimum when the door is opened. Theoretically, if the pressure of the inside and outside air was equal, there would be no turbulence and the risk of particle contamination would be minimized. Practically, with the accuracy of sensors and valve response delays, it can be difficult to get the pressure difference to near zero before opening the door. Also, adding long pressure stabilization delay times is to be avoided in the high-throughput environment of the semiconductor fabrication, where wafers are introduced, processed and then removed from the machine as fast as possible.

In summary, it would be beneficial if there existed a load lock system and method to minimize pressure bursts while operating at a high throughput. Further, it would be advantageous if the system and method adapted to changes in system's dynamic vent response.

SUMMARY

A system and method for venting a load lock chamber in a semiconductor processing tool is disclosed. The system and method include the use of a single pressure gauge inside the load lock to measure the pressure differential between the inside of the load lock and the outside atmosphere. By measuring this pressure at different parts of the vent cycle, it is possible to determine when to stop the load lock vent before the door is opened. A small, positive, target pressure burst is provided to the system's algorithm. This algorithm is autocorrecting so that the same target pressure burst can be provided, regardless of changes in the system's dynamic vent response, such as the regulated vent pressure or vent line piping differences from tool to tool. This system and method also allows for repeatable pressure bursts in load locks where increasingly high vent rates in semiconductor tools and inherent hardware delays in the system make it necessary to detect the rate of the pressure rise and start closing the vent valve before atmospheric pressure is achieved.

According to one embodiment, a method for venting a load lock chamber of a semiconductor processing tool is disclosed. The method comprises supplying a gas through a vent valve to the load lock chamber; measuring a rate of pressure rise within the load lock chamber while the gas is being supplied; determining a vent stop delay time, which defines when to disable the vent valve, based on a measured rate of pressure rise; closing the vent valve after the vent stop delay time; and opening a door of the load lock chamber, wherein a pressure burst is produced when the door is opened.

According to another embodiment, a load lock system is disclosed. The load lock system comprises a load lock chamber, having a door; a source of gas in communication with the load lock chamber via a vent valve; a pressure sensor disposed on the load lock chamber so as to measure a differential pressure between the load lock chamber and atmosphere; and a controller, wherein the controller actuates the vent valve to supply the gas to the load lock chamber; measures a rate of pressure rise within the load lock chamber using the pressure sensor while the gas is being supplied; determines a vent stop delay time, which defines when to disable the vent valve, based on a measured rate of pressure rise; closes the vent valve after the vent stop delay time; and opens the door of the load lock chamber, wherein a pressure burst is produced when the door is opened.

According to another embodiment, a non-transitory computer readable medium is disclosed. The computer readable medium comprises instructions, which, when executed by a controller, cause the controller to: actuate a vent valve to supply gas to a load lock chamber; measure a rate of pressure rise within the load lock chamber using a pressure sensor while the gas is being supplied; determine a vent stop delay time, which defines when to disable the vent valve, based on a measured rate of pressure rise; close the vent valve after the vent stop delay time; and open a door of the load lock chamber, wherein a pressure burst is produced when the door is opened. In a further embodiment, the computer readable medium further comprises instructions, which, when executed by the controller, cause the controller to: compare a magnitude and direction of the pressure burst to a pressure burst target, and alter the vent stop delay time based on a comparison of the magnitude and direction of the pressure burst and the pressure burst target.

BRIEF DESCRIPTION OF THE DRAWINGS

For a better understanding of the present disclosure, reference is made to the accompanying drawings, which are incorporated herein by reference and in which:

FIGS. 3A and 3B are signal charts illustrating an exemplary vent of a load lock with a low and high regulator pressure setting.

DETAILED DESCRIPTION

A method and system is disclosed that reduces particle contamination when a load lock door is opened to the fabrication area environment. This is achieved by predicting when to stop the vent so that a small, repeatable, positive pressure burst is produced each time the door is opened. The system and method measures the signal from a single differential pressure gauge inside the load lock at the end of the vent cycle, when the door initially opens and periodically while the door is open.

Further, the system provides for monitoring the differential pressure signal while the load lock is venting to determine the exact time at which the vent valve(s) may close so that a repeatable, small, outward pressure burst is produced when the door is opened.

Figure 1:
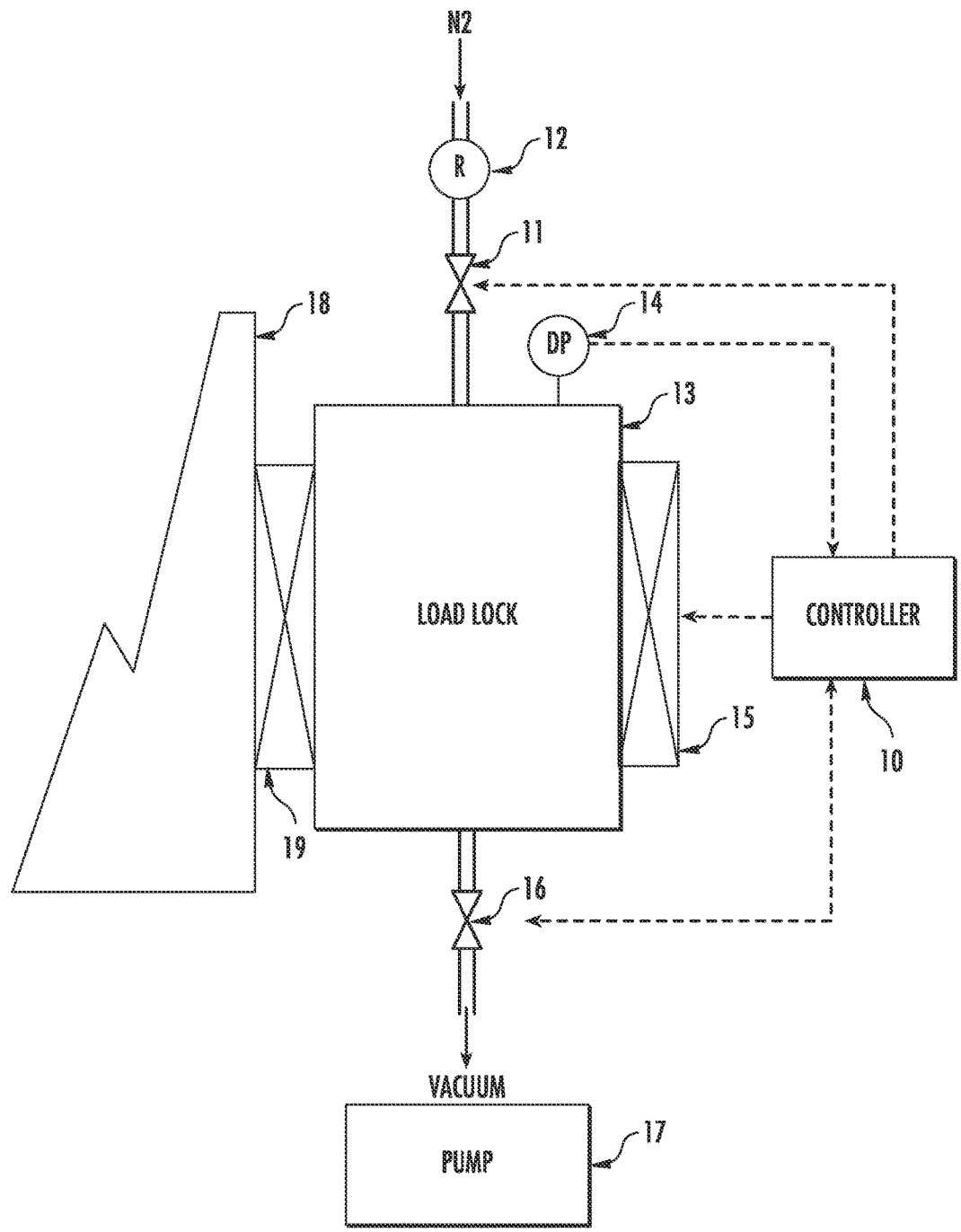
FIG. 1 is a system schematic view that illustrates a load lock chamber and various components according to one embodiment.

FIG. 1 shows a load lock chamber connected to a portion of a semiconductor processing tool. The load lock 13 forms part of a semiconductor tool 18 and allows for semiconductor substrates, such as wafers, to be loaded into the semiconductor tool 18 through the door 15 of the load lock 13. The semiconductor tool 18 may be any of various processing equipment tools used in the semiconductor manufacturing industry. Semiconductor tool 18 may be a high vacuum tool in which wafers are processed in near vacuum conditions or at very low pressures. Semiconductor tool 18 may be an ion implanter, an etching tool, a deposition tool or any of various other tools used in the semiconductor device fabrication industry. The type of semiconductor tool 18 is not limited by this disclosure.

The semiconductor substrates, which are typically in the form of wafers, first pass through the load lock 13 in order to get to the high vacuum processing portion of the semiconductor tool 18. First, the door 15 is opened to allow the unprocessed wafers to be inserted inside with a robot arm or other mechanical device. Next, the door 15 is closed and the air within the load lock 13 is removed by first opening up a rough valve 16 that connects the chamber of the load lock 13 to a rough pump 17. Such a system typically transitions to high vacuum by closing the rough valve 16 and opening up the chamber of the load lock 13 to a turbo pump (not shown). Once the chamber inside the load lock 13 has been pumped to high vacuum, a slot valve 19 opens up to allow a robot arm to extract wafers from the load lock 13 and put them into the process chamber of the semiconductor tool 18 for processing. After the wafers have been processed and returned to the load lock 13, the slot valve 19 is closed and the chamber of the load lock 13 is vented to return the chamber back to atmospheric pressure for removal from the semiconductor tool 18.

In this embodiment, differential pressure sensor 14 measures the pressure inside the load lock 13 and can be any type of sensor that is capable of measuring the difference in pressure between the inside of the load lock 13 and the outside. In another embodiment, this differential pressure may be determined from the top range of a blended gauge. A blended gauge is a hybrid pressure gauge where the top range of the gauge is the result of a differential pressure measurement from an internal relative pressure sensor and the lower range of the gauge is the result of an absolute pressure measurement from an absolute pressure sensor.

During the venting cycle, a vent valve 11 is opened up to allow an inert gas, such as nitrogen, to flow into the load lock 13 until its internal pressure increases to the pressure of the outside air. In most tools, all the stages of wafer transfer and processing inside the tool are optimized for maximum speed so that the tool can process as many substrates as possible in a certain amount of time (throughput). Typically, to keep the nitrogen flow at the vent stage set to a desired rate, a regulator 12 is manually adjusted to a certain pressure when the tool is set up prior to production. In order to speed up the vent cycle to increase throughput, this regulator 12 is sometimes set to as high a pressure as possible.

A controller 10 is in communication with the differential pressure sensor 14, the vent valve 11, a door valve that controls the door 15 of the load lock 13 and rough valve 16. The differential pressure sensor 14 may be of a piezoelectric sensor type or something similar that can accurately measure the difference in pressure between the inside of a vacuum chamber and the outside air. In some embodiments, a sensor that delivers a relative pressure measurement instead of an absolute pressure measurement may be used. The controller 10 includes a processing unit, such as a general purpose computer, a specifically designed microcontroller, or any other suitable processing unit. The processing unit is in communication with a memory element, also referred to as computer memory, which stores instructions to be executed by the processing unit. These instructions may allow the controller 10 to perform the method described herein. These instructions may be stored on any non-transitory computer readable storage medium. In operation, the controller 10 receives pressure readings from the differential pressure sensor 14, and outputs control signals which regulate the vent valve 11 and controls the door valve associated with the door 15 of the load lock 13, as will be described in more detail below. The computer memory may also be used to store various parameter values during operation.

Figure 2A:
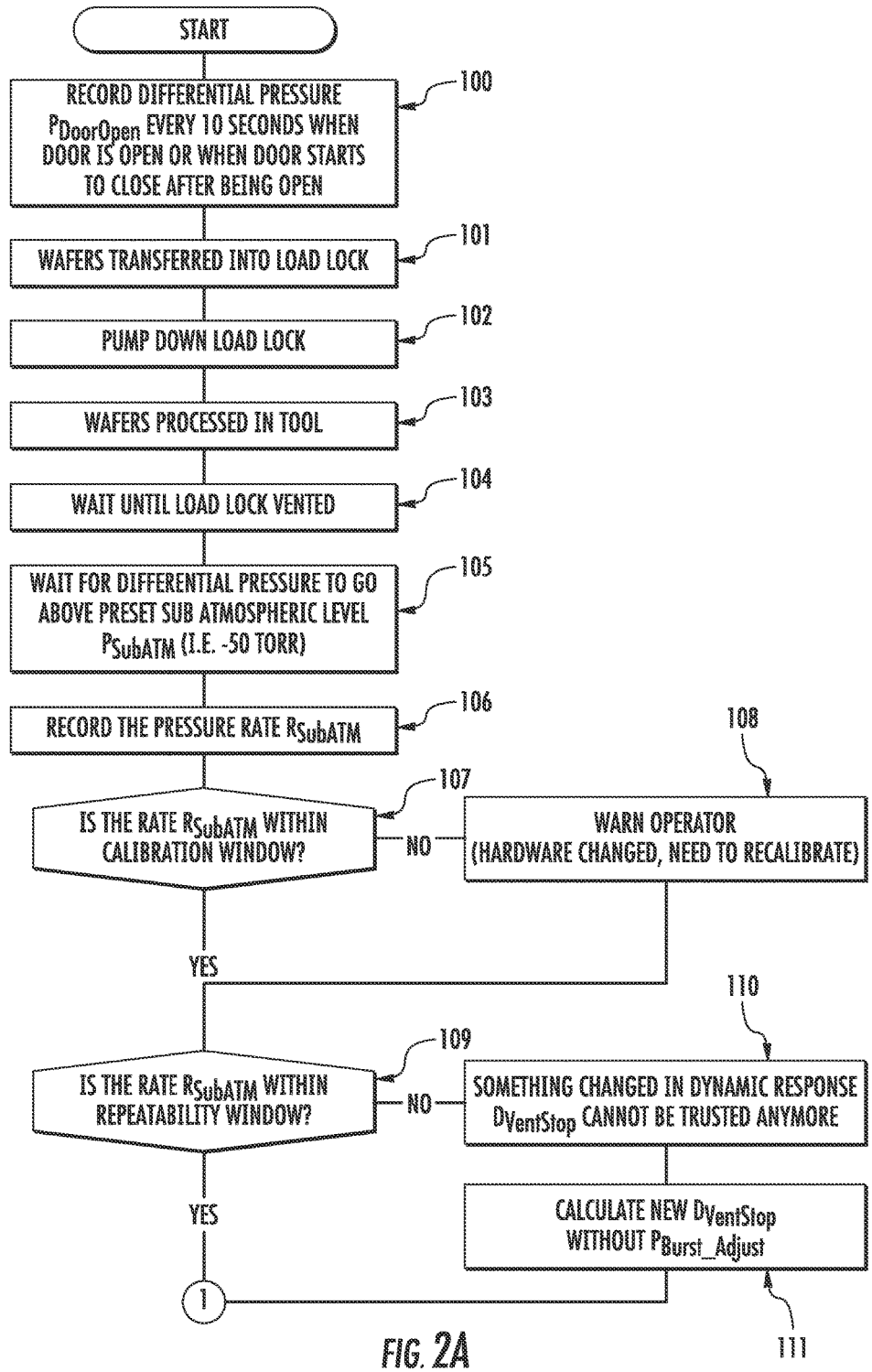
FIGS. 2A, 2B and 2C are flow charts illustrating an exemplary sequence of events for carrying out an embodiment of the disclosure.
Figure 2B:
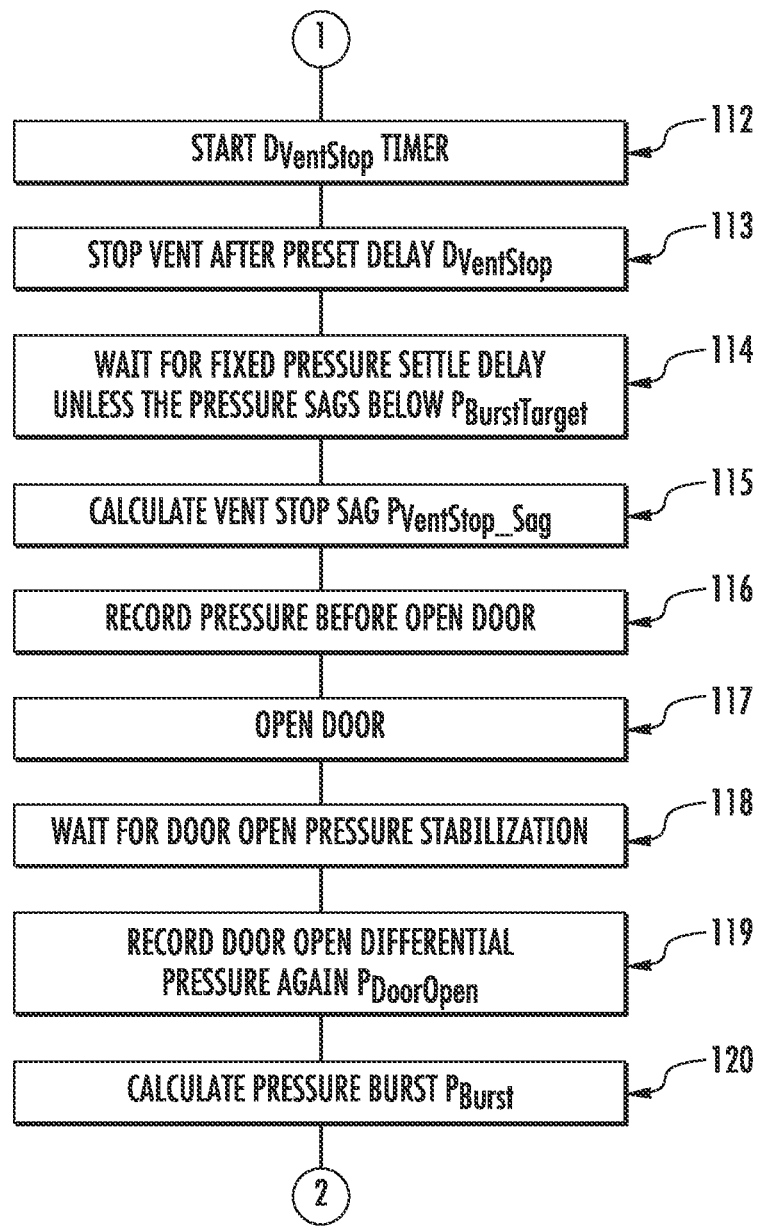
Figure 2C:
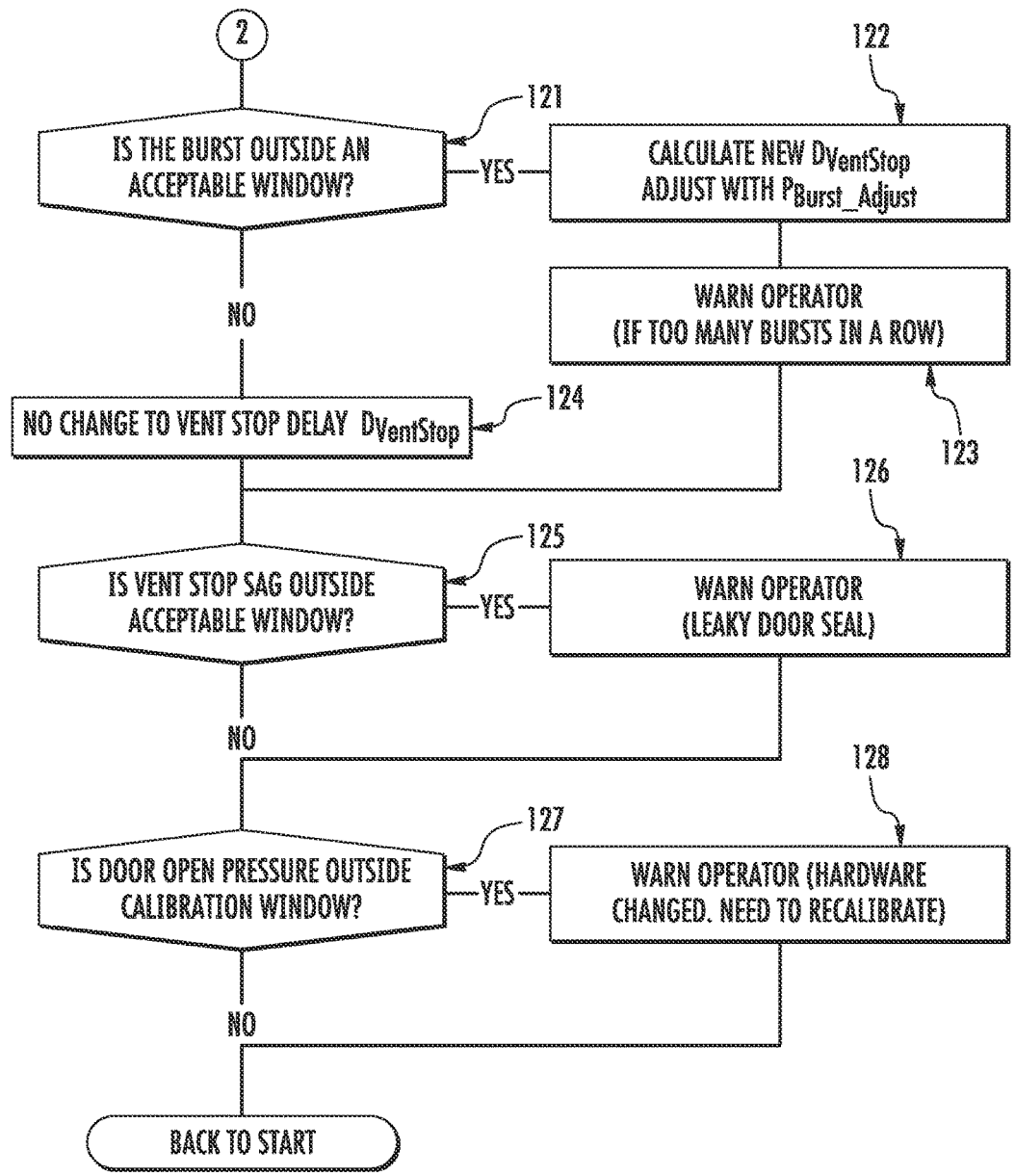

FIGS. 2A, 2B and 2C illustrate a flow chart that shows an exemplary sequence of operations according to an embodiment of the disclosure. This sequence of operations may be performed by the controller 10. This sequence of operations, when executed by the processing unit, may be referred to as an algorithm.

At process 100, the door 15 of the load lock 13 is open and the load lock 13 is empty and ready to accept unprocessed wafers for pumpdown. During this door-open time, the differential pressure, referred to as $P_{DoorOpen0}$, is recorded at a regular interval, such as every 10 seconds, to make sure it is stable. It will also be sampled when the door has been open for at least 10 seconds and then it starts to close again. Because this is a differential pressure gauge and the door is open, the pressure should record a differential pressure of 0 torr. If this $P_{DoorOpen}$ value changes by a significant level due to gauge drift, while the door is open, the system can issue a warning to the operator. The latest $P_{DoorOpen}$ value that was sampled while the door is open is loaded into computer memory for later use in the algorithm when the load lock 13 is vented up.

At process 101, unprocessed wafers are transferred into the load lock 13. After transfer, the door valve is actuated, which closes the door 15 of the load lock 13.

At process 102, the load lock 13 is pumped down into high vacuum by opening the rough valve 16, which is usually connected to a rough pump 17. After the rough cycle, the load lock system will usually switch over to second stage of pumping, with a turbo pump to bring the load lock down to pressures that are closer to the high vacuum pressures in the semiconductor tool 18, which may be a process chamber. Various suitable rough/hivac systems are available in the art and may be used.

At process 103, the slot valve 19 between the load lock 13 and the semiconductor tool 18 is opened so that the wafers can be handled into the process chamber by robot arms for processing. After processing, the wafers are returned to the load lock and the slot valve 19 is closed. Various suitable ways to move the wafers between the load lock and the process chamber and isolate the chambers from each other are available in the art and may be used.

At process 104, the controller 10 opens the vent valve(s) to start the vent cycle in order to bring the load lock pressure back up to atmospheric pressure. Conventional systems may be used to vent the load lock chamber, such as by purging with nitrogen or another inert gas. Various suitable purge/venting systems are available in the art and may be used. The rate of the vent is usually set by the pressure of the regulator 12.

At process 105, the method waits for the differential pressure between the inside of the load lock and the outside atmosphere to be within a preset difference, $P_{SubATM}$. This is lower than the desired crossover pressure at which the door will open. This is the threshold pressure at which the system will begin monitoring the rate of rise of the pressure within the load lock 13. In some embodiments, the value of $P_{SubATM}$ may be −50 torr, although other values may be used if desired.

At process 106, the pressure has risen so that the difference between the pressure within the load lock 13 and the atmosphere is within the $P_{SubATM}$ level. At this point, the rate of rise $R_{SubATM}$ of the pressure is recorded into memory for later use. This rate, measured in torr/sec, can be generated with different filters or time windows. In some embodiments, it may be the average pressure rise over a one second at the time of process 105. The differential pressure signal that is used to compare against the $P_{SubATM}$ level may not be heavily filtered because the pressure at which it stops the vent is preferably as close to the actual pressure as possible. Furthermore, the rate may be calculated before the $P_{SubATM}$ level is achieved. For example, in one embodiment, $R_{SubATM}$ is computed by calculating slope of a least squares fit line through 20 unfiltered pressure samples taken every 50 mSec for 1 second. This rate starts to update every 50 mSec at the beginning of the vent cycle so that by the time the $P_{SubATM}$ level is attained, an accurate rate has already been measured within the last second. In other embodiments, a different procedure may be used to calculate the rate of rise $R_{SubATM}$ of the pressure.

At process 107, the rate $R_{SubATM}$ of rise in the pressure is checked when it goes above the $P_{SubATM}$ level. For a given system that has had no changes in its hardware or dynamic response, this $R_{SubATM}$ should be the same as was previously measured. In other words, the rate of pressure increase within the load lock as it approaches atmospheric pressure may be repeatable, if there are no changes to the hardware or dynamic response of the system.

At process 108, if this $R_{SubATM}$ is significantly different from when the system was originally calibrated, the operator may be warned that something changed and prompted to investigate the venting system, especially the regulator setting. For example, if the regulator 12 was set to 6 PSI during the calibration routine several weeks prior, and the measured $R_{SubATM}$ during a vent cycle at that time was 10 torr/sec, the system expects that subsequent vents also measure a rate of 10 torr/sec when the pressure crosses over $P_{SubATM}$. However, after the calibration, another operator may alter the setting of the regulator 12 from one setting, such as 6 PSI, to a second setting, such as 50 PSI, without re-running the calibration routine. This would result in an increased rate of rise, such as about 54 torr/sec, at the same $P_{SubATM}$. Consequently, it will cause a very large pressure burst when the door is opened if the system does not shorten the vent stop delay accordingly. Process 111 describes how the system will accommodate for this change and create a new vent stop delay $D_{VentStop}$ on-the-fly so that the door still opens with the desired small, positive pressure burst. However, even though the system automatically adjusted itself to maintain the same pressure burst after the setting for the regulator 12 was changed from 6 to 50 PSI, the operator may still be notified to bring attention to this physical change in the system.

At process 109, the system will check to see if the $R_{SubATM}$ is within the repeatability window. This repeatability window may be smaller than the calibration window, checked in process 107. For example, in some embodiments, the repeatability window may be +/−3 torr/sec, although other values may be used. For a given system that has had no changes in its hardware or dynamic response, this $R_{SubATM}$ may be the same as the time before.

At process 110, if this $R_{SubATM}$ is outside the repeatability window, the system determines that something has changed in the system and the vent stop delay $D_{VentStop}$ that the system used the last time cannot be trusted. For example, if the operator changed the regulator pressure from 10 PSI to 50 PSI without running a new calibration routine, this process would detect that the rate was suddenly much greater than the expected rate.

At process 111, since this pressurization rate, $R_{SubATM}$, was outside the bounds of the repeatability window, the system will automatically recalculate a new theoretical $D_{VentStop}$ as follows:

$$D_{VentStop} = [(P_{DoorOpen} + P_{BurstTarget}) - P_{SubATM}]/R_{SubATM}$$

where $P_{DoorOpen}$ is the most recent differential pressure measurement from when the door was last open, which theoretically should be zero. $P_{BurstTarget}$ BurstTarget is the pressure burst target, which may be about 4 torr, which may be calculated to be the midpoint of the acceptable burst range set by the customer or tool operator. $P_{SubATM}$ is the preselected differential pressure at which this calculation is done, which, as described above, may be about −50 torr and $R_{SubATM}$ is the rate of the pressure rise in torr/sec at this time. This calculation may also include small negative offset to account for the response delay of the vent valve pneumatics and gauge filtering delay.

By taking the $R_{SubATM}$ rate into the calculation, the system autocorrects for significant changes in the rate which could be due to changes in the regulator pressure, or changes to other settings. For example, in some embodiments, the actual pressure of nitrogen that is delivered to the regulator 12 may vary. In this case, the setting of the regulator 12 may not reflect the actual pressure of the incoming nitrogen. In some embodiments, the time to close the vent valve 11 or the door 15 may vary over time, and may drift from that which exists when the calibration routine was executed. In addition, differences in the tubes used to deliver the nitrogen may affect the actual pressure that is present at the load lock 13. For example, if the regulator 12 is disposed away from the load lock 13, the pressure at the load lock 13 may be less than that indicated by the regulator 12.

At process 112, the $D_{VentStop}$ delay timer is started and the system will wait until this timer has expired. This $D_{VentStop}$ delay is either the same delay that was used during last vent cycle if the $R_{SubATM}$ rate was within the repeatability window or it will be the new value that is calculated in process 111.

At process 113, the $D_{VentStop}$ delay timer has expired and the system sends a control signal to close the vent valve(s) 11. Because of the delay time between sending the control signal to close the valve and the actual closing and halting of the flow, the pressure within the load lock 13 will continue to rise. This pressure rise overshoot may become more significant with higher vent rates, such as when the regulator pressure is set to a high value.

At process 114, the system waits for a fixed amount of settling time, which may be about 2 seconds, unless the pressure sag falls below the differential pressure burst target $P_{BurstTarget}$.

At process 115, the sag in the pressure during the settling time, referred to as $P_{VentStop\_Sag}$, is measured.

At process 116, the differential pressure before the door is opened is measured.

At process 117, the door 15 of the load lock 13 is opened.

At process 118, the method waits for a filtered differential pressure measurement to stabilize. This filtered differential pressure measurement may be obtained by using the controller 10 to perform a filtering function on the pressure readings read from the differential pressure sensor 14. This wait period may be any suitable value, such as about 5 seconds.

At process 119, this filtered differential pressure measurement is taken and stored as $P_{DoorOpen}$. In some embodiments, the differential pressure signal during the vent cycle that is used to compare to the $P_{SubATM}$ level does have a heavy filter because its value may be as close to the actual pressure as possible. However, when the door is open, it is expected that the differential pressure measurement is zero and any fluctuation is most likely due to line noise or gauge drift. Therefore, a heavy filter can be used on this signal for improved accuracy. In other embodiments, this signal may not be filtered when the door is open.

At process 120, the $P_{Burst}$ can be calculated now that the latest $P_{DoorOpen}$ differential pressure measurement has been made. The $P_{Burst}$ Burst simply the difference in the pressure measurement before the door was opened and the $P_{DoorOpen}$ pressure afterwards.

At process 121, the system checks to see if the $P_{Burst}$ value is outside the acceptable burst range set by the customer or tool operator.

At process 122, a new $D_{VentStop}$ is calculated if the burst, $P_{Burst}$, is outside the acceptable burst range. This new $D_{VentStop}$ may calculated as follows:

$$D_{BurstAdjust}=P_{Burst}-P_{BurstTarget})/R_{SubATM}$$

$$T_{VentStopCalculated}=[(P_{DoorOpen}+P_{BurstTarget})-P_{SubATM}]/R_{SubATM}$$

$$D_{VentStop}=T_{VentStopCalculated}-D_{Burst\_Adjust}$$

$$D_{VentStopNew}=0.5*(D_{VentStop}+D_{VentStopOld})$$

Because this $D_{VentStop}$ is performed right after an actual measured pressure burst, it can include the magnitude and direction of the pressure burst to improve the accuracy for next time. The method autocorrects for abnormally large pressure bursts by measuring $P_{Burst}$ and modifying the new $D_{VentStop}$ delay to get it closer to the pressure burst target, $P_{BurstTarget}$, for the next vent cycle. Standard autocorrecting filtering may be done by only modifying the new $D_{VentStop}$ with a portion of this $P_{Burst}$. The system also counts the number of consecutive door openings where the $P_{Burst}$ is outside the acceptable burst range.

In process 123, if, for some reason there are too many vent cycles in a row that result in a pressure burst outside the acceptable burst range, the system can initiate a warning or error message to the operator. This may happen if the acceptable burst range is set too tight or a high regulator pressure makes the pressure reading abnormally noisy during the vent. In these cases, the operator may investigate the system, and may make a change, such as adjusting the acceptable burst range and/or adjusting the regulator pressure.

In process 124, the pressure burst, $P_{Burst}$, was within the acceptable burst range. In this case, the $D_{VentStop}$ will remain unchanged.

In process 125, the system checks the magnitude of the vent sag to see if it is outside an acceptable window. This vent sag is a combination of the pressure overshoot due to the vent valve delay time and possible door valve seal leaks that relieve this overpressure. It could also be an artifact due to the relaxation of a piezoelectric sensor disposed inside the differential pressure sensor. In some embodiments, this sag may be allowed to settle out before the door opens to avoid an abnormally high pressure burst. If the sag is actually a sensor artifact, allowing it to settle before opening up the door will avoid this abnormally high pressure burst measurement.

In process 126, the operator may be warned by the system if the vent sag magnitude is too large. In some embodiments, the threshold for vent sag may be about 12 torr, although other values may be used. In this case, the operator may check to make sure the door valve is properly aligned and may check to make sure the door valve seals are clean and leak free so that the load lock is able to hold a reasonable overpressure.

In process 127, the system checks the door open pressure $P_{DoorOpen}$ to make sure it remains within an acceptable range. Since this is a differential pressure gauge it should remain close to zero when the door is open regardless of the absolute atmospheric pressure.

In process 128, the operator may be warned by the system to recalibrate the differential pressure gauge because the $P_{DoorOpen}$ door open pressure drifted outside an acceptable range (i.e. +/−5 torr). This may also be due to a faulty gauge.

After re-calibrating or replacing the gauge the pressure burst calibration routine may be re-run.

In each case where the operator receives a warning, the system may alert the operator in a number of ways. In some embodiments, the controller 10 is in communication with a display device (not shown), and the warning is displayed on the display device. In other embodiments, the controller 10 may be in communication with a communications network, such that messages, such as email messages or text messages, may be sent to the operator. Of course, other methods of delivering a warning to the operator may also be used.

Figure 3A:
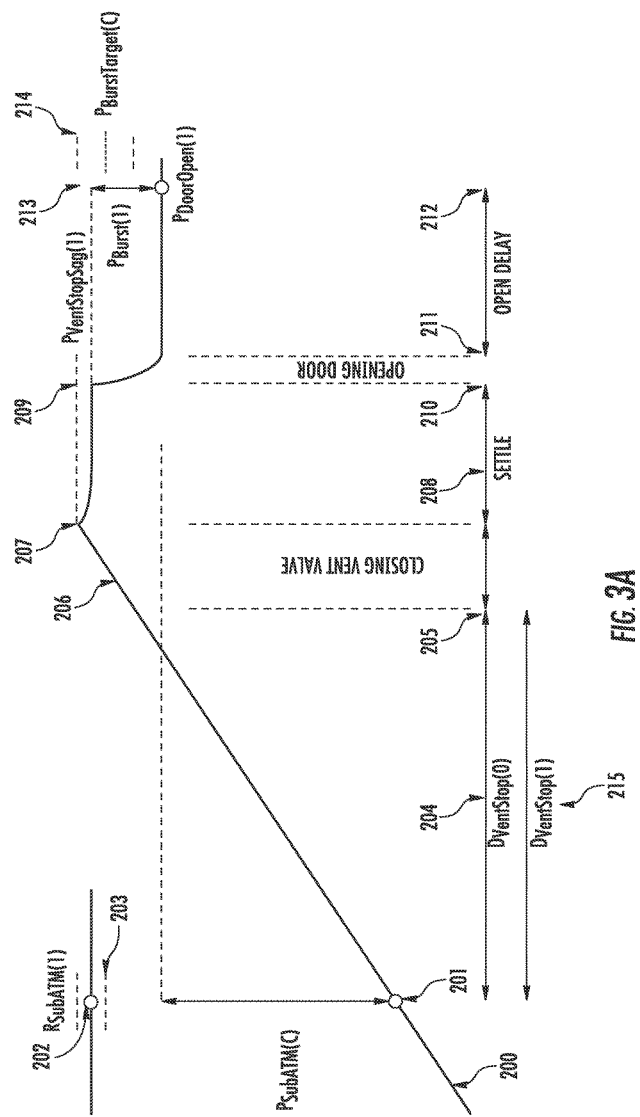

FIG. 3A illustrates a signal response trend that shows an exemplary vent of a load lock with a low regulator pressure.

At time 200, the load lock is venting up at a slow rate, such as about 6 torr/sec, because the regulator pressure is low. In this example, the regulator pressure may be about 10 PSI.

At time 201, the differential pressure attains the present difference between the pressure within the load lock and the atmospheric pressure, established at calibration $P_{SubATM(C)}$. At this time, the pressure within the load lock may be 50 torr away from atmospheric equilibrium.

At time 202, the system takes a sample of a filtered rate of rise $R_{SubATM(1)}$ signal that has been continuously updated since the beginning of the vent. In this example, the rate of rise is about 6 torr/sec.

At time 203, the system checks to see if $R_{SubATM(1)}$ within a certain tolerance, such as within about +/−5% of the rate of rise determined at calibration. In this example, no change has been made to the dynamic response of the system, such as regulator pressure. Therefore, $R_{SubATM}$ remains within the expected tolerance window established during system calibration.

At time 204, the system starts the $D_{VentStop(0)}$ delay timer and waits for it to expire. The system continues to vent up towards atmosphere during this time.

At time 205, the $D_{VentStop(0)}$ expires and the system starts to close the vent valve.

At time 206, because the vent valve hardware and control system may have significant delay times, the pressure in the load lock may continue to rise after the command to close the valves has been sent. For example, at a slow vent rate of 6 torr/sec, a pneumatic vent valve delay of 500 mSec will result in a 3 torr pressure rise after the command to close the valve has been issued. This 3 torr pressure rise is significant when compared to the pressure burst tolerances of load lock systems in semiconductor manufacturing equipment, which may utilize small burst target tolerances, such as less than +/−2 torr.

At time 207, the vent valve physically closes and the pressure stops rising.

At time 208, the system waits for a fixed pressure settle delay, such as about 2 seconds. The system will start opening up the load lock door after this delay has expired or if the pressure due to the sag falls below the pressure burst target.

At time 209, the settle delay has expired and the system is about to open the door. At this point, the system measures the $P_{VentStopSag(1)}$ after the vent valve was commanded to close. This is the difference between the peak pressure after commanding the valve to close and the pressure right before the door is about to open. This sag pressure could be due to leaky door valve seals and may be used to warn the operator if the magnitude of this sag is excessive, such as greater than 20 torr. The sag could also be due to artifact from the relaxation of a piezoelectric differential pressure sensor when the venting is stopped. In this case, this sag magnitude would not be used to warn the operator because it is an artifact of normal system operation. In some embodiments, the sag may not be measured.

At time 210, the command to open the door is sent. The differential pressure is measured right before this command is sent so that the door open pressure burst magnitude and direction can be later calculated.

At time 211, the system detects that the door is fully open and starts a fixed door open delay timer. The semiconductor tool can transfer material to and from the load lock at this point.

At time 212, the door open delay timer expires and a filtered sample of the differential pressure sensor is taken to determine the door open pressure $P_{DoorOpen(1)}$. Theoretically, this should always be 0 torr but small offsets in the gauge may accumulate over time due to gauge sensor drift.

At time 213, the magnitude and direction of the door open pressure burst $P_{Burst(1)}$ is measured. This is the difference between the differential pressure sampled right before the door was opened and the door open pressure $P_{DoorOpen(1)}$.

At time 214, the difference between the burst $P_{Burst(1)}$ and the desired pressure burst target $P_{BurstTarget(C)}$, established at calibration is measured. In this case, the difference was within the burst repeatability tolerance established at calibration (such as +/−3 torr) so no change is made to the vent stop delay $D_{VentStop}$ for the next vent cycle. In short, the system is within the calibrated tolerances and the burst is close to the target so no changes are made for next time.

At time 215, the new vent stop delay $D_{VentStop(1)}$ used for the next vent cycle is the same as the current $D_{VentStop(0)}$.

FIG. 3B illustrates a signal response trend that shows an exemplary vent of a load lock after the operator has changed the regulator 12 from a low to a high pressure without running any calibration routine. This figure is exemplary of the autocorrect feature of this system. The figure illustrates how the system automatically adjusts to the faster vent rate, avoids a large pressure burst, learns the new vent rate and warns the operator. In this example, the venting rate is set to 50 torr/sec because the regulator pressure is set to a high value, such as 50 PSI.

At time 300, the load lock is venting up at a fast rate because the regulator pressure is high.

At time 301, the differential pressure attains the present difference between the pressure within the load lock and the atmospheric pressure, established at calibration $P_{SubATM(C)}$. At this time, the pressure within the load lock may be 50 torr away from atmospheric equilibrium.

At time 302, the system takes a sample of a filtered rate of rise $R_{SubATM(2)}$ signal that has been continuously updated since the beginning of the vent. In this example, the rate of rise is about 50 torr/sec.

At time 303, the system checks to see if $R_{SubATM(2)}$ within a certain tolerance of the last time the rate was measured (i.e. $R_{SubATM(1)}$ from FIG. 3A). In this example, there has been a large increase in the vent rate because an operator changed the regulator vent pressure. Since $R_{SubATM(2)}$ is outside the expected tolerance window established during system calibration, the operator may be notified with a warning or error message. However, since semiconductor tools are frequently under remote control without operators and the material is still removed from the machine, a vent routine is expected to continue. In this case, the system is aware that a significant change has been made to the load lock vent rate and it can no longer trust the $D_{VentStop(1)}$ delay to deliver a pressure burst within acceptable tolerances.

At time 304a, because $R_{SubATM(2)}$ was out of tolerance, the system does not use the $D_{VentStop(1)}$ delay that was established with the low regulator pressure (see FIG. 3A). If this delay was used, the load lock could experience a severe over pressurization and resultant door open pressure burst.

At time 304b, the system calculates a theoretical vent stop delay $D_{VentStop(T)}$, as explained in process 111. Next, the system starts this vent delay timer and waits for it to expire. In this example, this vent delay, $D_{VentStop(T)}$, for this higher vent pressure is significantly smaller than the $D_{VentStop(1)}$ delay established for the low vent pressure. The system continues to vent up towards atmosphere during this time.

At time 305, the $D_{VentStop(T)}$ expires and the system starts to close the vent valve.

At time 306, because the vent valve hardware and control system may have significant delay times, the pressure in the load lock may continue to rise after the command to close the valves has been sent. For this example, at a fast vent rate of 50 torr/Second, a pneumatic vent valve delay of 500 mSec will result in a 25 torr pressure rise after the command to close the valve has been sent. This 25 torr pressure rise is severe when compared to the pressure burst tolerances of load lock systems in semiconductor manufacturing equipment, which may utilize burst target tolerances of less than +/−2 torr.

At time 307, the vent valve physically closes and the pressure stops rising.

At time 308, the system waits for a fixed pressure settle delay. The system will start opening up the load lock door after this delay has expired or if the pressure due to the sag falls below the pressure burst target. In this case, the pressure sagged below the pressure burst target level of $P_{BurstTarget(C)}$ so the door starts to open at this time before waiting for the settle delay timer to expire.

At time 309, the system is about to open the door. At this point, the system measures the $P_{VentStopSag(2)}$ after the vent valve was commanded to close.

At time 310, the command to open the door is sent.

At time 311, the system detects that the door is fully open and starts a fixed door open delay timer.

At time 312, the door open delay timer expires and a filtered sample of the differential pressure sensor is taken to determine the door open pressure $P_{DoorOpen(2)}$.

At time 313, the magnitude and direction of the door open pressure bust $P_{Burst(2)}$ is measured.

At time 314, the difference between the burst $P_{Burst(2)}$ and the desired pressure burst target $P_{BurstTarget(C)}$ established at calibration is measured. In this case, the difference was within the burst repeatability tolerance established at calibration, so no change is made to the vent stop delay $D_{VentStop(T)}$ for the next vent cycle. In short, even though the system is outside the vent rate tolerances because the regulator pressure was changed, the system is within the burst tolerances and the burst is close to the target so no changes are made for next time.

At time 315, the new vent stop delay $D_{VentStop(2)}$ for the next vent cycle is set to what the new $D_{VentStop(T)}$ was. In this example, the autocorrect feature of this system is evident with this much smaller $D_{VentStop(2)}$ having been automatically calculated with the new vent rate of the system $R_{SubATM(2)}$. As mentioned in time 303, the operator can be continuously warned during each vent cycle that the vent rate is outside the limits established during the low pressure regulator calibration. They could, in turn, inspect the hardware and recalibrate the system and re-adjust the regulator. In the meantime, the tool can continue to run at the high regulator pressure with pressure bursts within acceptable tolerances without operator intervention.

This system and method optimize the sequence leading up to and including the load lock door opening so that any resulting pressure burst is controlled, minimizing particle contamination.

The system has the ability to produce a small, repeatable positive pressure burst each time the door is opened. In some embodiments, the pressure burst is about 4 torr. This burst insures that negative pressure flow into the load lock is avoided and minimizes load lock pressure flow out of the load lock when the door is opened into the fabrication area environment.

One aspect is the ability of the system to adjust to changes in the load lock vent rate. The rate of rise in pressure depends primarily upon the flow of the inert gas into the load lock. This flow rate, in turn, depends upon the conductance of the lines and pressure of the gas, which is typically set by a regulator 12. Because of the high throughput demands of the semiconductor industry, processed wafers are typically removed from the machine as fast as possible. Therefore, operators may turn up the regulator pressure as high as possible so that the vent cycle takes less time. However, venting the load lock too quickly can lead to large pressure bursts when the door opens if the control system fails to close the vent valve 11 before the chamber achieves a pressure significantly higher than the outside atmospheric pressure. This trade-off between high throughput and minimal pressure bursts can lead to a wide range of regulator pressure settings for the same tool type at different customer sites and even from machine to machine at the same customer site. The autocorrecting algorithm of this system will take this into account so that the same, small positive pressure burst is achieved regardless of changes in the vent rate.

Another aspect of this system is that it will allow for inherent delays in the response time of the vent valve closure and the pressure gauge response time so that actions to stop the venting begin to take place before the load lock has achieved a particular crossover pressure that could result in an ideal pressure burst. On high throughput systems, the vent rates can be so high that the load lock will continue to pressurize even after the control system has sent the command for the valve to close. For example, a pneumatic valve could take about 500 mSec to actually close. At a typical vent rate of 50 torr/sec, the pressure within the load lock has already risen another 25 torr after the system sends the command to close the valve. Filtering on the gauge pressure signal means that the actual pressure is higher than what is measured during a vent. This difference between actual and measured is more pronounced at higher vent rates. In short, the combination of the valve delay and the gauge pressure sensor filtering means that it is necessary for the system to send the command to stop the venting before the measured load lock pressure is at a desired crossover pressure. The present system contemplates these delays and adjusts accordingly.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A load lock system, comprising:
   a load lock chamber, having a door;
   a source of gas in communication with the load lock chamber via a vent valve;
   a pressure sensor disposed on the load lock chamber so as to measure a differential pressure between the load lock chamber and atmosphere; and
   a controller, wherein the controller:
      actuates the vent valve to supply the gas to the load lock chamber;
      measures a rate of pressure rise within the load lock chamber using the pressure sensor while the gas is being supplied;
      determines a vent stop delay time, which defines when to disable the vent valve, based on a measured rate of pressure rise;
      closes the vent valve after the vent stop delay time; and
      opens the door of the load lock chamber, wherein a pressure burst is produced when the door is opened.

2. The load lock system of claim 1, wherein the pressure sensor is a differential pressure sensor.

3. The load lock system of claim 1, wherein a magnitude and direction of the pressure burst is measured by the controller based on the differential pressure between the load lock chamber and atmosphere before the door is opened.

4. The load lock system of claim 3, wherein the controller compares a magnitude and direction of the pressure burst to a pressure burst target, and the controller alters the vent stop delay time based on a comparison of the magnitude and direction of the pressure burst and the pressure burst target.

5. The load lock system of claim 4, wherein the vent stop delay time is altered according to a mathematical relationship between the vent stop delay time, the magnitude and direction of the pressure burst, and the pressure burst target.

6. The load lock system of claim 1, wherein the controller stores the vent stop delay time, and wherein a previously stored value of the vent stop delay time is used if the measured rate of pressure rise is within a predetermined repeatability window.

7. The load lock system of claim 6, wherein a new value of the vent stop delay time is calculated by the controller if the measured rate of pressure rise is outside the predetermined repeatability window.

8. The load lock system of claim 7, wherein the vent stop delay time is calculated according to a mathematical relationship between a pressure burst target and the measured rate of pressure rise.

9. A non-transitory computer readable storage medium, comprising instructions, which, when executed by a controller, cause the controller to:
   actuate a vent valve to supply gas to a load lock chamber;
   measure a rate of pressure rise within the load lock chamber using a pressure sensor while the gas is being supplied;
   determine a vent stop delay time, which defines when to disable the vent valve, based on a measured rate of pressure rise;
   close the vent valve after the vent stop delay time; and
   open a door of the load lock chamber, wherein a pressure burst is produced when the door is opened.

10. The non-transitory computer readable storage medium of claim 9, further comprising instructions, which, when executed by the controller, cause the controller to:
   compare a magnitude and direction of the pressure burst to a pressure burst target, and
   alter the vent stop delay time based on a comparison of the magnitude and direction of the pressure burst and the pressure burst target.

* * * * *